United States Patent [19]

De Keyzer et al.

[11] Patent Number: 5,536,618
[45] Date of Patent: Jul. 16, 1996

[54] METHOD FOR MAKING A LITHOGRAPHIC PRINTING PLATE ACCORDING TO THE SILVER SALT DIFFUSION TRANSFER PROCESS

[75] Inventors: René De Keyzer, Waasmunster; Paul Callant, Edegem; Jean-Marie Dewanckele, Drongen; Marcel Monbaliu, Mortsel, all of Belgium

[73] Assignee: AGFA-Gevaert, N.V., Mortsel, Belgium

[21] Appl. No.: 395,100

[22] Filed: Feb. 27, 1995

[30] Foreign Application Priority Data

Mar. 25, 1994 [EP] European Pat. Off. .............. 94200792

[51] Int. Cl.$^6$ .............................. G03C 5/38; G03C 8/06; G03F 7/07

[52] U.S. Cl. .......................... 430/204; 430/234; 430/251; 430/455; 430/459

[58] Field of Search .................................. 430/204, 251, 430/455, 456, 454, 234

[56] References Cited

U.S. PATENT DOCUMENTS

| | | | |
|---|---|---|---|
| 4,126,459 | 11/1978 | Greenwald | 430/251 |
| 4,251,617 | 2/1981 | Bloom et al. | 430/251 |
| 4,837,132 | 6/1989 | Fujimoto et al. | 430/380 |
| 5,200,294 | 4/1993 | De Keyzer et al. | 430/204 |
| 5,258,258 | 11/1993 | Matsuhara et al. | 430/204 |
| 5,268,253 | 12/1993 | Van Rompuy | 430/204 |
| 5,391,457 | 2/1995 | Hayashi | 430/204 |

*Primary Examiner*—Richard L. Schilling
*Attorney, Agent, or Firm*—Breiner & Breiner

[57] ABSTRACT

The present invention provides a method for making a lithographic printing plate according to the silver salt diffusion transfer process comprising the steps of exposing and developing an imaging element comprising on a support a silver halide emulsion layer and an image-receiving layer in the presence of a silver halide solvents corresponding to the following formula:

$$Z^1-(R^1-X^1)_n-(R^2-X^2)-L-(X^3-R^3)-(X^4-R^4)_m-Z^2 \quad (I)$$

wherein $X^1$, $X^2$, $X^3$ and $X^4$ each independently represents —S—, —NH— or —N($R^5$—$Z^3$)—, $R^1$, $R^2$, $R^3$, $R^4$ and $R^5$ each independently represents an alkylene, an alkenylene or an alkynylene, n and m each independently represents an integer from 0 to 4, $Z^1$, $Z^2$ and $Z^3$ each independently represents hydrogen, an alkyl group, an amino group, an ammonium group, a hydroxyl, a sulfo group, a carboxyl, an aminocarbonyl or an aminosulfonyl, and L represents an ethylene or a $C_3$–$C_4$ divalent linking chain, having a group preventing free rotation within this divalent linking chain, $X^2$ and $X^3$ being in the thermodynamically most stable conformation of said compound in a favorable position for complexation with a silver ion.

8 Claims, No Drawings

METHOD FOR MAKING A LITHOGRAPHIC PRINTING PLATE ACCORDING TO THE SILVER SALT DIFFUSION TRANSFER PROCESS

DESCRIPTION

1. Field of the Invention

The present invention relates to a method for making a lithographic printing plate according to the silver salt diffusion transfer process.

2. Background of the Invention

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellent ink-receptive areas on a water-receptive ink-repellent background. For example, typical lithographic printing plates are disclosed e.g. EP-A-423399 and EP-A-410500.

The DTR-image can be formed in the image-receiving layer of a sheet or web material which is a separate element with respect to the photographic silver halide emulsion material (a so-called two-sheet DTR element) or in the image-receiving layer of a so-called single-support-element, also called mono-sheet element, which contains at least one photographic silver halide emulsion layer integral with an image-receiving layer in water-permeable relationship therewith. It is the latter mono-sheet version which is preferred for the preparation of offset printing plates by the DTR method.

As for other printing plates it is required that the printing plates obtained according to the DTR-process have a high printing endurance, good ink acceptance in the printing areas and no ink acceptance in the non-printing areas (no toning). It is furthermore desirable that the number of copies that have to be disposed of because of ink acceptance in the non-printing areas (so called toning) during start-up of the printing process is limited.

With respect to these requirements the state of the transferred silver i.e. the silver formed in the image-receiving layer plays a very important role. It is important that a strong wear resistant silver image is formed in the image receiving layer to obtain a high printing endurance and that the precipitation of silver in the non-printing areas is kept as low as possible to avoid staining and toning of the plate. It is thus important that the silver image to be used for printing is of high contrast and sharpness.

Still further it is required that the transfer solution has a high capacity meaning i.a. that only a minimum amount of sludge is formed in said solution even when a sizable amount of imaging material is processed.

Although other factors have an influence on the aforementioned requirements the type of silver halide solvent influences the mentioned requirements to a large extent.

Recently a number of new silver halide solvents have been proposed. In GB-P-2,081,465 thioether and dithioether compounds are disclosed. In DE-4,237,427 and U.S. Pat. No. 5,200,294 thioether and polythioether compounds which may comprise an amino group, preferably a substituted one, are disclosed. In U.S. Pat. No. 5,258,258 pyridine derivatives containing at least one thioether or polythioether substituent are disclosed. In JP-05/197.155 1,3-dithio-2-thiones which may contain two thioether substituents are disclosed. In JP-04/323.661 ethylenediamines are disclosed. By using these compounds in the development and transfer step of the DTR-imaging elements an improvement in the printing poperties of the obtained printing plate is obtained. However the achieved results are still not quite satisfactory. Furthermore the use of these compounds causes a rapid formation of sludge in the transfer solution resulting in a need for frequent replenishment of said solution.

3. Summary of the Invention

It is an object of the present invention to provide a method for making a lithographic printing plate according to the DTR-process having good printing properties i.a. good ink acceptance in the printing areas, no ink acceptance in the non-printing areas, a high contrast and sharpness and a high printing endurance.

It is a further object of the present invention to provide a method for making a lithographic printing plate according to the DTR-process with a transfer solution having a low replenishment frequency.

Still further objects of the present invention will become clear from the description hereinafter.

According to the present invention there is provided a method for making a lithographic printing plate according to the DTR-process comprising the steps of information-wise exposing an imaging element comprising on a support a silver halide emulsion layer and an image-receiving layer containing physical development nuclei and developing said information-wise exposed imaging element using an alkaline processing liquid in the presence of developing agent(s) and silver halide solvent(s), characterized in that at least one of said silver halide solvents is a compound corresponding to the following formula:

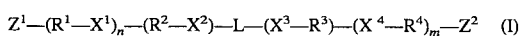

$$Z^1-(R^1-X^1)_n-(R^2-X^2)-L-(X^3-R^3)-(X^4-R^4)_m-Z^2 \quad (I)$$

wherein $X^1$, $X^2$, $X^3$ and $X^4$ each independently represents —S—, —NH— or —N($R^5$—$Z^3$)—, $R^1$, $R^2$, $R^3$, $R^4$ and $R^5$ each independently represents an alkylene, an alkenylene or an alkynylene, n and m each independently represents an integer from 0 to 4, $Z^1$, $Z^2$ and $Z^3$ each independently represents hydrogen, an alkyl group, an amino group, an ammonium group, a hydroxyl, a sulfo group, a carboxyl, an aminocarbonyl or an aminosulfonyl, and L represents an ethylene or a $C_3$–$C_4$ divalent linking chain, having a group preventing free rotation within this divalent linking chain, $X^2$ and $X^3$ being in the thermodynamically most stable conformation of said compound in a favourable position for complexation with a silver ion.

According to the present invention there is also provided an imaging element and an alkaline processing liquid for use in the above defined method.

4. Detailed Description of the Invention

After extensive research it has been found that lithographic printing plates with improved printing properties can be obtained when an information-wise exposed imaging element comprising on a support a silver halide emulsion layer and an image-receiving layer containing physical development nuclei is developed with an alkaline processing liquid in the presence of developing agent(s) and a silver halide solvent corresponding to formula (I). Printing plates with good ink acceptance in the printing areas, no ink acceptance in the non-printing areas, a high contrast and sharpness and a high printing endurance are obtained. Furthermore, good copies are obtained from the start of the printing process so that only a limited number of copies have to be disposed of during start-up of the printing process. In addition the use of these compounds slows down the formation of sludge in the transfer solution resulting in a higher capacity of said solution.

In said formula I, $R^1$, $R^2$, $R^3$, $R^4$ and $R^5$ each independently representing an alkylene, an alkenylene or an alkynylene may be substituted and/or may contain an oxygen. L may represent a ethylene, 1,3-propylene, 1,3- propenylene, 1,4-butylene or 1,4-butenylene divalent linking chain, which may be substituted.

Examples of compounds corresponding to formula (I) contain as the above mentioned divalent linking chain L one of the following structures $L^1$ to $L^4$:

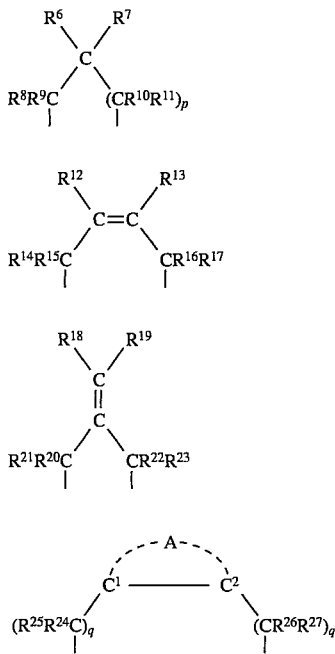

wherein $R^6$ and $R^7$ each independently represents a $C_1$–$C_4$ alkyl group which may be substituted and optionally contains an oxygen and/or sulfur and/or nitrogen bridge. $R^{12}$, $R^{13}$, $R^{18}$ and $R^{19}$ each independently represents an hydrogen atom, a $C_1$–$C_4$ alkyl group which may be substituted and optionally contains an oxygen and/or sulfur and/or nitrogen bridge or $R^6$ and $R^7$, $R^{12}$ and $R^{13}$ or $R^{18}$ and $R^{19}$ together with the atoms to which they are attached complete a ring which may be substituted and optionally contains one or two divalent radicals such as oxygen, sulfur, nitrogen or an ethenylene group, with the proviso that when $R^{12}$ and $R^{13}$ together with the atoms to which they are attached complete a ring which may be substituted it is preferably an alicyclic ring, $R^8$, $R^9$, $R^{10}$, $R^{11}$, $R^{14}$, $R^{15}$, $R^{16}$, $R^{17}$, $R^{20}$, $R^{21}$, $R^{22}$, $R^{23}$, $R^{24}$, $R^{25}$, $R^{26}$ and $R^{27}$ each independently represents an hydrogen atom or a $C_1$–$C_4$ alkyl group which may be substituted and optionally contains an oxygen and/or sulfur and/or nitrogen bridge, A represents the necessary atoms for completing a 5- or 6-membered ring which may be substituted and optionally contains one or two divalent radicals such as oxygen, sulfur, nitrogen or a ethenylene group, $C^1$ and $C^2$ are linked by a single bond and p and q each independently represents 0 or 1.

Preferred structures for the above mentioned divalent linking chains $L^1$ to $L^4$ are those wherein $R^6$ and $R^7$ each independently represents a methyl group a —($X^5$—$R^{28}$)—($X^6$—$R^{29}$)$_r$ —$Z^4$ group wherein $X^5$ and $X^6$ each independently represents —S—, —NH— or —N($R^{30}$—$Z^3$)—, $R^{28}$, $R^{29}$ and $R^{30}$ each independently represents a $C_1$–$C_4$ alkylene which may be substituted and optionally contains an oxygen bridge, r represents 0 or 1 and $Z^4$ represents hydrogen, an amino group, an ammonium group, a hydroxyl, a sulfo group or a carboxyl, $R^{12}$, $R^{13}$, $R^{18}$ and $R^{19}$ each represents a hydrogen atom or $R^6$ and $R^7$ or $R^{18}$ and $R^{19}$ together with the atoms to which they are attached complete a 5- or 6-membered ring which may be substituted and optionally contains one or two divalent radicals such as oxygen, sulfur, nitrogen or an ethenylene group and $R^{12}$ and $R^{13}$ together with the atoms to which they are attached complete a 5- or 6-membered alicyclic ring which may be substituted, $R^8$, $R^9$, $R^{10}$, $R^{11}$, $R^{14}$, $R^{15}$, $R^{16}$, $R^{17}$, $R^{20}$, $R^{21}$, $R^{22}$, $R^{23}$, $R^{24}$, $R^{25}$, $R^{26}$ and $R^{27}$ each represents an hydrogen atom, A represents the necessary atoms for completing a cyclohexane or a tetrahydrofurane, p represents 0 and q represents 0 or 1.

Preferred compounds corresponding to formula (I) are those wherein $X^2$ and $X^3$ each represents —S—, $X^1$ and $X^4$ each independently represents —S—, —NH— or —N($R^5$—$Z^3$)—, $R^1$, $R^2$, $R^3$, $R^4$ and $R^5$ each independently represents a (—$CH_2$)$_s$— wherein s represents 2 or 3, n and m each independently represents 0 or 1 and $Z^1$, $Z^2$ and $Z^3$ each independently represents hydrogen, an amino group which may be substituted by a $C_1$–$C_3$ alkyl group or be part of a ring which may be substituted and optionally contains one or two divalent radicals such as oxygen, sulfur, nitrogen or a ethenylene group e.g. —N(CH$_3$)$_2$, —N(C$_2$H$_5$)$_2$, —N(CH$_2$CH$_2$CN)$_2$, —N[CH$_2$CH(OH)CH$_2$OH]$_2$, —NH$_2$, morpholino, piperazino etc., an ammonium group e.g. trimethylammonium, a hydroxyl, a sulfo group or a carboxyl.

More preferred compounds corresponding to formula (I) are those mentioned in the previous paragraph containing as divalent linking chain L one of the structures $L^1$ to $L^4$ as described above.

Particularly preferred compounds corresponding to formula (I) are those mentioned in the previous paragraph containing as divalent linking chain L one of the preferred structures for $L^1$ to $L^4$ as described above.

Specific examples are listed in table 1

Table 1

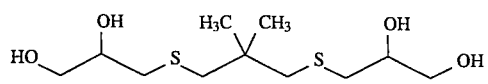 (1)

-continued
Table 1
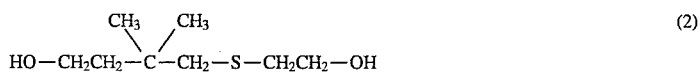 (2)
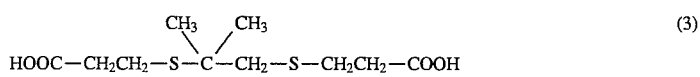 (3)
CH₃C(CH₂—S—CH₂CH₂—OH)₃ (4)
C(CH₂—S—CH₂CH₂—OH)₄ (5)
 (6)
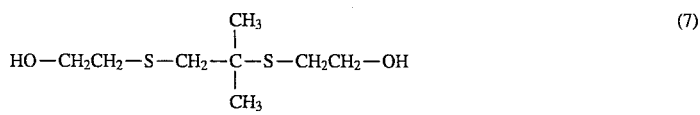 (7)
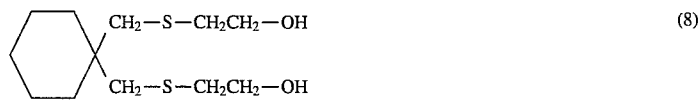 (8)
HO—CH₂CH₂—S—CH₂—CH=CH—CH₂—S—CH₂CH₂—OH (9)
(cis)
HOOC—CH₂CH₂—S—CH₂—CH=CH—CH₂—S—CH₂CH₂—COOH (10)
(cis)
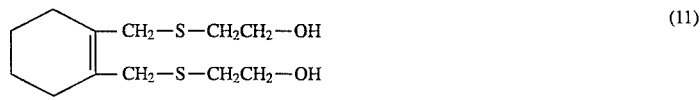 (11)
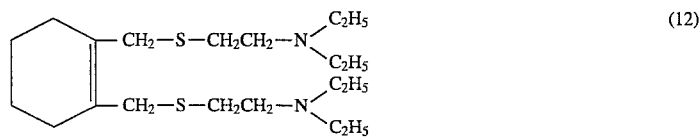 (12)
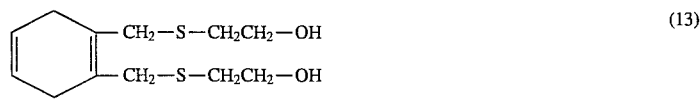 (13)
 (14)
cis-trans
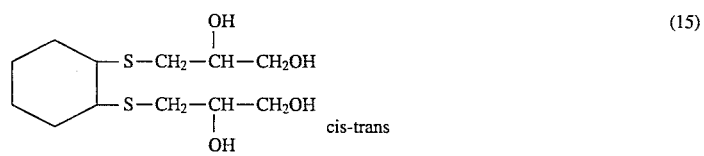 (15)
cis-trans
 (16)
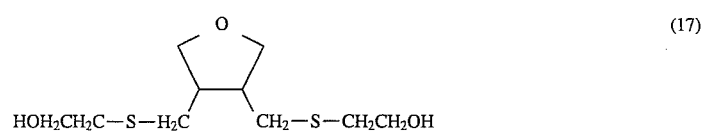 (17)

-continued
Table 1

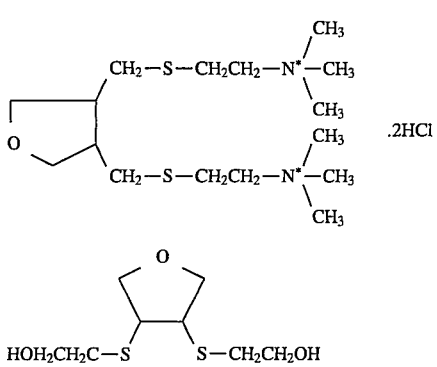

(18)

(19)

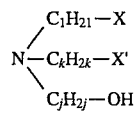

HOH₂CH₂C—S    S—CH₂CH₂OH

The compounds represented by formula (I) can be synthesized using well-known methods as described e.g. in FR-P 1,108,788, *Organic Chemistry*, Vol. 26, pp. 1991 to 1995 (1961).

In U.S. Pat. No. 4,126,459 thioether substituted silver halide solvents are described which contain heterocyclic rings. It is disclosed that said compounds are useful in both conventional and diffusion transfer photography. It can however not be concluded from said disclosure that said compounds are useful in a method for making a printing plate. In U.S. Pat. No. 4,837,132 an aliphatic ring substituted with two amino groupd is disclosed for use in the processing of a color photographic material. Here too it can not be concluded from said disclosure that said compounds are useful in a method for making a printing plate.

The above silver halide solvents corresponding to formula (I) are preferably used in the alkaline processing liquid in a concentration between 0.1% and 5% by weight when used as the sole silver halide solvent. When the compounds of formula (I) are used in combination with other silver halide solvents the concentration may be lowered to e.g. 0.05% by weight. Said silver halide solvents according to formula (I) may also be contained at least partially in one or more layers of the imaging element.

Suitable silver halide solvents for use in combination with the silver halide solvents of formula (I) are alkanolamines. Examples of alkanolamines that may be used in connection with the present invention correspond to the following formula:

$$N \begin{cases} C_lH_{2l}-X \\ C_kH_{2k}-X' \\ C_jH_{2j}-OH \end{cases}$$

wherein X and X' independently represent hydrogen, a hydroxyl group or an amino group, l and k represent 0 or integers of 1 or more and j represents an integer of 1 or more.

According to the present invention the alkanolamines are preferably present in the alkaline processing liquid in a concentration preferably between 0.1% and 5% by weight. However part or all of the alkanolamine can be present in one or more layers of the imaging element.

Especially suitable silver halide solvents for use in combination with the silver halide solvent corresponding to formula (I) are meso-ionic compounds, more preferably triazolium thiolares and most preferably 1,2,4-triazolium-3-thiolates. Preferably at least part and most preferably all of the meso-ionic compound is present in the alkaline processing liquid used for developing the image-wise exposed imaging element. Preferably the amount of meso-ionic compound in the alkaline processing liquid is between 0.1 mmol/l and 25 mmol/l and more preferably between 0.5 mmol/l and 10 mmol/l and most preferably between 1 mmol/l and 5 mmol/l.

However the meso-ionic compound may be incorporated in one or more layers comprised on the support of the imaging element. The meso-ionic compound is preferably contained in the imaging element in a total amount between 0.1 and 10 mmol/m², more preferably between 0.1 and 0.5 mmol/m² and most preferably between 0.5 and 1.5 mmol/m². More details are disclosed in EP-A-0,554,585

Other silver halide solvents suitable for use in combination with the silver halide solvent corresponding to formula (I) are e.g. 2-mercaptobenzoic acid, cyclic imides, oxazolidones, alkali thiocyanates and thiosulfates in amounts between 0.01% and 5% by weight in the alkaline processing liquid.

The alkaline processing liquid used in accordance with the present invention preferably has a pH between 10 and 13. Said pH may be established by an organic or inorganic alkaline substance or a combination thereof. Suitable inorganic alkaline substances are e.g. potassium or sodium hydroxide, carbonate, phosphate etc.. Suitable organic alkaline substances are e.g. alkanolamines. In the latter case the alkanolamines will provide or help providing the pH and serve as a silver halide complexing agent.

The alkaline processing liquid may also contain the developing agent(s) used in accordance with the present invention. In this case the alkaline processing liquid is called a developer. On the other hand some or all of the developing agent(s) may be present in one or more layers of the imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone. However other developing agents can be used.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners.

Development acceleration can be accomplished with the aid of various compounds comprised in the alkaline processing liquid and/or in one or more layers of the photographic element, preferably polyalkylene derivatives having a molecular weight of at least 400 such as those described in e.g. U.S. Pat. Nos. 3,038,805—4,038,075—4,292,400—4,975,354.

According to one preferred mode of the present invention an imaging element is used comprising on a support in the order given a photosensitive silver halide emulsion layer and an image receiving layer containing physical development nuclei. According to the present invention said imaging element is information-wise exposed in an apparatus according to its particular application, e.g. a conventional process camera containing a conventional light source or a laser containing device.

The thus obtained information-wise exposed imaging element is subsequently developed using an alkaline processing liquid as described above, said alkaline processing solution preferably also contains hydrophobizing agents for improving the hydrophobicity of the silver image obtained in the image receiving layer.

The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents. Particularly preferred hydrophobizing agents are mercapto-1,3,4-thiadiazoles as described in DE-A 1,228,927 and in U.S. Pat. No. 4,563,410, 2-mercapto-5-heptyl- oxa-3,4-diazole, long chain (at least 5 carbon atoms) alkyl substituted mercaptotetrazoles and compounds corresponding to one of the following formulas:

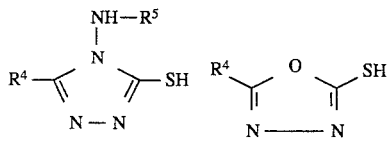

wherein $R^6$ represents hydrogen or an acyl group, $R^5$ represents alkyl, aryl or aralkyl. The hydrophobizing agents can be used alone or in combination with each other.

Preferably the hydrophobizing agents are contained in the alkaline processing solution in an amount between 0.3 g/l and 1.5 g/l.

Said development step is preferably followed by a neutralization of the surface of the imaged element by guiding the element through a neutralization liquid having a pH between 5 and 7. The neutralization liquid preferably contains a buffer e.g. a phosphate buffer, a citrate buffer or mixture thereof. The neutralization solution can further contain bactericides, e.g. phenol, thymol or 5-bromo-5-nitro-1,3-dioxan as described in EP 0,150,517. The liquid can also contain substances which influence the hydrophobic/hydrophilic balance of the printing plate obtained after processing of the DTR element, e.g. silica. Finally the neutralization solution can contain wetting agents, preferably compounds containing perfluorinated alkyl groups.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose acetate film, poly(ethylene terephthalate) film or poly-Alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminum may also be used in accordance with the present invention.

The image receiving layer containing physical development nuclei used in accordance with the present invention is preferably free of hydrophilic binder but may comprise small amounts upto 30% by weight of the total weight of said layer of a hydrophilic colloid e.g. polyvinyl alcohol to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

The photosensitive layer used in accordance with the present invention comprises at least one photosensitive silver halide emulsion and a hydrophilic colloid binder.

The photographic silver halide emulsion(s) for coating a silver halide emulsion layer in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

For use in connection with the present invention the silver halide emulsion or emulsions preferably consist principally of silver chloride while a fraction of silver bromide may be present ranging from 1 mole % to 40 mole %. Most preferably a silver halide emulsion containing at least 70 mole % of silver chloride is used. The emulsions containing more than 5 mole % of silver bromide preferably belong to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated.

The average size of the silver halide grains may range from 0.10 to 0.70 µm, preferably from 0.25 to 0.45 µm.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-6}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-A 493,464 and 568,687, and polyamines such as diethylene triamine or derivatives of aminoethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. Koslowsky, Z. Wiss. Photogr. Photophys. Photochem. 46, 65–72 (1951).

The emulsions of the DTR element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds e.g. phenylmercaptotetrazole, quaternary benzothiazole derivatives, and benzotriazole.

The silver halide emulsions may contain pH controlling ingredients. Preferably the emulsion layer is coated at a pH value below the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. Nos. 4,092,168, 4,311,787, DE-P 2,453,217.

In an especially preferred embodiment the emulsion layer contained in the imaging element contains a compound which comprises in its molecular structure a group capable of adsorbing to silver halide and a group capable of reducing silver halide. Compounds of this kind have been disclosed in EP-A-449340. In this way a combination of a stabilizing and a development activating function in one compound is achieved.

More details about the composition, preparation and coating of silver halide emulsions can be found in e.g. Product Licensing Index, Vol. 92, December 1971. publication 9232, p. 107–109.

In addition to the above described emulsion layer and image receiving layer other hydrophilic colloid layers in water permeable relationship with these layers may be present. For example it is especially advantageous to include a base-layer between the support and the photosensitive silver halide emulsion layer. In a preferred embodiment of the present invention said base-layer serves as an antihalation layer. This layer can therefore contain the same light-absorbing dyes as described above for the emulsion layer; as alternative finely divided carbon black can be used for the same antihalation purposes as described in U.S. Pat. No. 2,327,828. On the other hand, in order to gain sensitivety, light reflecting pigments, e.g. titaniumdioxide can be present. Further this layer can contain hardening agents, matting agents, e.g. silica particles, and wetting agents. At least part of these matting agents and/or light reflection pigments may also be present in the silver halide emulsion layer the most part however preferably being present in said base-layer. As a further alternative the light reflecting pigments may be present in a separate layer provided between the antihalation layer and the photosensitive silver halide emulsion layer.

In a preferred embodiment in connection with the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value below the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the vinylsulfone type e.g. methylenebis(sulfonylethylene), aldehydes e.g. formaldehyde, glyoxal, and glutaraldehyde, N-methylol compounds e.g. dimethylolurea and methyloldimethylhydantoin, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic emulsion layer or in at least one other hydrophilic colloid layer. Examples of suitable surface-active agents are described in e.g. EP-A-92203007.7. Preferably compounds containing perfluorinated alkyl groups are used. Such surface-active agents can be used for various purposes e.g. as coating aids, as compounds preventing electric charges, as compounds improving slidability, as compounds facilitating dispersive emulsification and as compounds preventing or reducing adhesion.

The photographic material of the present invention may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, alpha-beta-unsaturated dicarboxylic acids, hydroxyalkyl (meth)acrylates, sulphoalkyl (meth)acrylates, and styrene sulphonic acids.

According to another embodiment of the present invention a lithographic printing plate can be obtained by means of the DTR-process using an imaging element comprising in the order given a hydrophilic base, an optional layer of physical development nuclei and a silver halide emulsion layer. The hydrophilic base can be a hardened hydrophilic layer, containing a hydrophilic synthetic homocopolymer or copolymer such as a homocopolymer or copolymer of vinylalcohol and being hardened with a hydrolyzed tetraalkyl orthosilicate crosslinking agent coated on a flexible hydrophobic support or a grained and anodized aluminum support.

The imaging element of the present embodiment may be imaged using a camera-exposure or a scanning exposure as described above followed by a development step in the presence of development agent(s) and silver halide solvent(s) according to the invention so that a silver image is formed in the physical development nuclei layer or directly on the aluminum support. Subsequently the silver halide emulsion layer and any other optional hydrophilic layers are removed by rinsing the imaged element with water so that the silver image is exposed. Finally the hydrophobic character of the silver image is preferably improved using a finishing liquid comprising hydrophobizing agents as described above.

To facilate the removal of the silver halide emulsion layer it is advantageous to provide a layer between the hydrophilic base and the silver halide emulsion layer comprising a hydrophilic non-proteinic film-forming polymer e.g. polyvinyl alcohol, polymer beads e.g. poly(meth)acrylate beads or mixtures thereof. Such type of layers are disclosed in EP-A-483415 and EP-A-410500.

The present invention will now be illustrated by the following examples without however limiting it thereto. All parts are by weight unless otherwise specified.

EXAMPLE 1 (Comparative Example)

Preparation of the Silver Halide Emulsion Coating Solution

A silver chloride emulsion was prepared by the double jet precipitation method. The average silver halide grain size was 0.26 µm (diameter of a sphere with equivalent volume). The emulsion was stabilized by 1-phenyl-5-mercapto-tetrazole.

A base layer coating solution was prepared having the following composition:

| | |
|---|---|
| gelatin | 5.5% |
| carbon black | 0.76% |
| silica particles (5 µm) | 1.6% |

Preparation of the Imaging Element

The emulsion coating solution and base layer coating solution were simultaneously coated by means of the cascade coating technique to a polyethylene coated paper support provided with a pack of two backing layers such that the base layer coating was coated directly to the side of the support opposite to the side containing said backing layers. The emulsion layer was coated such that the silver halide coverage expressed as $AgNO_3$ was 2 $g/m^2$ and the gelatin content was 2.1 $g/m^2$. The emulsion layer further contained 0.15 $g/m^2$ of 1-phenyl-4,4'-dimethyl-3-pyrazolidone and 0.25 $g/m^2$ of hydroquinone. The base layer was coated such that the amount of gelatin in the coated layer was 2 $g/m^2$.

The layer nearest to the support of the backing layer pack contained 0.3 $g/m^2$ of gelatin and 0.5 $g/m^2$ of the antistatic agent co(tetraallyloxyethane/methacrylate/acrylic acid-K-salt) polymer. The second backing layer contained 4 $g/m^2$ of gelatin, 0.15 $g/m^2$ of a matting agent consisting of transparent spherical polymeric beads of 3 micron average diameter according to EP 0080225, 0.05 $g/m^2$ of hardening agent triacrylformal and 0.021 $g/m^2$ of wetting agent $F_{15}C_7$—$COONH_4$.

The thus obtained element was dried and subjected to a temperature of 40° C. for 5 days and then the emulsion layer was overcoated with a layer containing PdS as physical development nuclei, hydroquinone at 0.4 $g/m^2$ and formaldehyde at 100 $g/m^2$.

The following processing solutions were prepared:

| Activator solutions A–H: having the following common ingredients but differing in the respective thioethers as revealed in table 2, all used in a concentration of 0.1 mol/l: | |
|---|---|
| sodium hydroxide (g) | 30 |
| sodium sulphite anh. (g) | 25 |
| 1-phenyl-5-mercapto-tetrazole (mg) | 50 |
| ethylene diamine tetraacetic acid tetrasodium salt (g) | 2 |
| demineralized water to make | 1 l |
| pH (24° C.) = 13 | |

| Activator solutions I–N: having the following common ingredients but differing in the respective thioethers as revealed in table 3, all used in a concentration of 0.1 mol/l: | |
|---|---|
| sodium hydroxide (g) | 30 |
| sodium sulphite anh. (g) | 35 |
| 2-mercapto-5-n.heptyl-oxa-3,4-diazole (mg) | 150 |
| ethylene diamine tetraacetic acid tetrasodium salt (g) | 1 |
| 1,4,5-trimethyl-1,2,4-triazoliumthiolate (mmole) | 5.2 |
| demineralized water to make | 1 l |
| pH (24° C.) = 13 | |

| Neutralization solution | |
|---|---|
| citric acid | 10 g |
| sodium citrate | 35 g |
| sodium sulphite anh. | 5 g |
| phenol | 50 mg |

| | |
|---|---|
| demineralized water to make | 1 l |

Dampening solution

| | |
|---|---|
| water | 880 ml |
| citric acid | 6 g |
| boric acid | 8.4 g |
| sodium sulphate anh. | 25 g |
| ethyleneglycol | 100 g |
| colloidal silica | 28 g |

The above described imaging element was image-wise exposed and processed with one of the above described activator solutions A —0 for 10 seconds at 30° C., subsequently neutralized at 25° C. with the neutralization solution described above and dried.

The sensitometric properties of the developed imaging elements were characterized by measuring the minimum and maximum transmission densities (Dtr) and reflection densities (Dr). The plate contrast in transmission ($\Delta$Dtr) and reflection ($\Delta$Dr) were then obtained as follows:

$$\Delta Dtr = Dtr_{max} - Dtr_{min}$$

$$\Delta Dr = Dr_{max} - Dr_{min}$$

The formation of sludge by processing an imaged element in an activating or developing solution is measured by the following reliable simulation. Under continuous stirring, there is added to 1 l of an activating solution a silver chloride emulsion having an average silver halide grain size of 0.2 µm (diameter of a sphere with equivalent volume) in an amount that corresponds to 0.25 mmol of silver halide. After 10 minutes, there is further added 0.0125 mmol of 1-phenyl-4-dimethyl-3-pyrazolidone and 0.125 mmol of hydroquinonemonosulfate. The amount of formation of sludge in the different activating solutions after standing for 24 h is visually compared with those in the reference solution I, containing no thioether compound. The qualitative evaluation was expressed by the following scale:

+: more sludge than the reference
=: as much sludge as the reference
−: less sludge than the reference
—: considerably less sludge than the reference

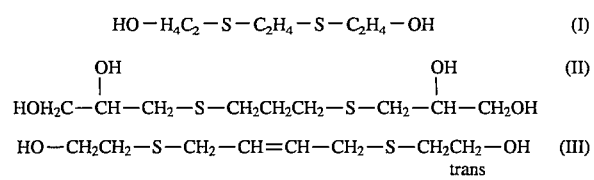

The results are given in table 2 for the imaging elements processed in activators A—H and in table 3 for the imaging elements processed in activators I—N.

TABLE 2

| Activator | AgX-solvent | $\Delta$Dtr | $\Delta$Dr |
|---|---|---|---|
| A | cpd I | 0.70 | 0.91 |
| B | cpd II | 0.32 | 0.71 |
| C | cpd III | 0.23 | 0.61 |
| D | cpd 1-table 1 | 1.15 | 0.95 |
| E | cpd 2-table 1 | 1.04 | 0.90 |
| F | cpd 9-table 1 | 0.96 | 0.91 |
| G | cpd 14-table 1 | 1.11 | 0.90 |
| H | cpd 15-table 1 | 1.14 | 0.91 |

TABLE 3

| Activator | AgX-solvent | $\Delta$Dtr | $\Delta$Dr | Sludge |
|---|---|---|---|---|
| I | none | 0.47 | 0.66 | Ref. |
| J | cpd II | 0.74 | 0.77 | = |
| K | cpd III | 0.69 | 0.74 | = |
| L | cpd 1-table 1 | 0.88 | 0.71 | − |
| M | cpd 2-table 1 | 0.95 | 0.76 | − |
| N | cpd 9-table 1 | 1.01 | 0.76 | =/− |

Evaluation:

From the above it can be seen that the plate contrast in transmission ($\Delta$Dtr), which is related to the printing endurance, is much higher for the imaging elements processed in an activator containing compounds of table 1 (compounds in accordance with the invention) than for the imaging elements processed in an activator containing compounds I,II or III (comparison compounds). Furthermore the plate contrast in reflection ($\Delta$Dr), which is related to inkt acceptance and absence of toning is at least as high and mostly markedly higher for the imaging elements processed in an activator free of triazoliumthiolates containing compounds of table 1 (compounds in accordance with the invention) than for the imaging elements processed in such an activator containing compounds I,II or Ill (comparison compounds). When using an activating solution containing 1,4,5-trimethyl-1,2,4-triazoliumthiolate, the plate contrast in reflection ($\Delta$Dr) is about the same for the different plates. However, the sludge formation in such an activator containing compounds of table 1 (compounds in accordance with the invention) is (clearly) improved versus the sludge formation in an activator containing compounds II or III (comparison compounds).

EXAMPLE II (Comparative example)

Preparation of the Silver Halide Emulsion Coating Solution

A silver chlorobromide emulsion composed of 98.2% of chloride and 1.8% of bromide was prepared by the double jet precipitation method. The average silver halide grain size was 0.4 µm (diameter of a sphere with equivalent volume) and contained Rhodium ions as internal dopant. The emulsion was orthochromatically sensitized and stabilized by 1-phenyl-5-mercapto-tetrazole.

A base layer coating solution was prepared having the following composition:

| | |
|---|---|
| gelatin | 5.5% |
| carbon black | 0.76% |
| silica particles (5 µm) | 1.6% |

Preparation of the Imaging Element

The emulsion coating solution and base layer coating solution were simultaneously coated by means of the cascade coating technique to a polyethylene coated paper support provided with a pack of two backing layers such that the base layer coating was coated directly to the side of the support opposite to the side containing said backing layers. The emulsion layer was coated such that the silver halide coverage expressed as AgNO$_3$ was 1.5 g/m$^2$ and the gelatin content was 1.5 g/m$^2$. The emulsion layer further contained 0.15 g/m$^2$ of 1-phenyl-4,4'-dimethyl-3-pyrazolidone and 0.25 g/m$^2$ of hydroquinone. The base layer was coated such that the amount of gelatin in the coated layer was 3 g/m².

The layer nearest to the support of the backing layer pack contained 0.3 g/m² of gelatin and 0.5 g/m² of the antistatic agent co(tetraallyloxyethane/methacrylate/acrylic acid-K-salt) polymer. The second backing layer contained 4 g/m² of gelatin, 0.15 g/m² of a matting agent consisting of transparent spherical polymeric beads of 3 micron average diameter according to EP 0080225, 0.05 g/m² of hardening agent triacrylformal and 0.021 g/m² of wetting agent $F_{15}C_7$—COONH$_4$.

The thus obtained element was dried and subjected to a temperature of 40° C. for 5 days and then the emulsion layer was overcoated with a layer containing PdS as physical development nuclei, hydroquinone at 0.4 g/m² and formaldehyde at 100 g/m². The following processing solutions were prepared:

| Activator | P | Q |
|---|---|---|
| sodium hydroxide (g) | 30 | 30 |
| sodium sulphite anh. (g) | 35 | 35 |
| compound I (g) | 15 | 0 |
| compound 9 of table 1 (g) | 0 | 17 |
| 1,4,5-trimethyl-1,2,4-triazoliumthiolate (mg) | 250 | 250 |
| 2-mercapto-5-n.heptyl-oxa-3,4-diazole (mg) | 150 | 150 |
| water to make | 1 l | 1 l |
| Neutralization solution | | |
| citric acid | 10 g | |
| sodium citrate | 35 g | |
| sodium sulphite anh. | 5 g | |
| phenol | 50 mg | |
| water to make | 1 l | |
| Dampening solution | | |
| water | 880 ml | |
| citric acid | 6 g | |
| boric acid | 8.4 g | |
| sodium sulphate anh. | 25 g | |
| ethyleneglycol | 100 g | |
| colloidal silica | 28 g | |

The above described imaging element was information-wise exposed in a HeNe laser containing image-setter and processed with one of the above described activator solutions P or Q for 10 seconds at 30° C., subsequently neutralized at 25° C. with the neutralization solution described above and dried.

The printing plates thus prepared were mounted beside each other on the same offset printing machine (Heidelberg GTO-46) so that both plates were printed under identical conditions. The described dampening solution was used at a 5% concentration in an aqueous solution containing 10% isopropanol as fountain solution and K+E 125, marketed by Kast+Ehinger, A. G., Germany, was used as ink. A compressible rubber blanket was used.

Evaluation:

The number of copies that can be printed before white spots appear in the ink accepting areas amounts to 5000 for the printing plate obtained by processing the imaging element in activating solution P (comparison) and to 7000 for the printing plate obtained by processing the imaging element in activating solution Q (activating solution in accordance with the invention). So the printing endurance of offset printing plates prepared according to the present invention is clearly improved.

We claim:

1. A method for making a lithographic printing plate according to the silver salt diffusion transfer process comprising the steps of information-wise exposing an imaging element comprising on a support a silver halide emulsion layer and an image-receiving layer containing physical development nuclei and developing said information-wise exposed imaging element using an alkaline processing liquid in the presence of developing agent(s) and silver halide solvent(s), characterized in that at least one of said silver halide solvents is a compound corresponding to the following formula:

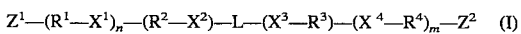

$$Z^1-(R^1-X^1)_n-(R^2-X^2)-L-(X^3-R^3)-(X^4-R^4)_m-Z^2 \quad (I)$$

wherein $X^1$, $X^2$, $X^3$ and $X^4$ each independently represents —S—, —NH— or —N($R^5$—$Z^3$)—; $R^1$, $R^2$, $R^3$, $R^4$ and $R^5$ each independently represents an alkylene, an alkenylene or an alkynylene; n and m each independently represents an integer from 0 to 4; $Z^1$, $Z^2$ and $Z^3$ each independently represents hydrogen, an alkyl group, an amino group, an ammonium group, a hydroxyl, a sulfo group, a carboxyl, an aminocarbonyl or an aminosulfonyl, $X^2$ and $X^3$ being in the thermodynamically most stable conformation of said compound in a favorable position for complexation with a silver ion, characterized in that L has one of the following structures $L^1$ to $L^4$;

(L¹)

(L²)

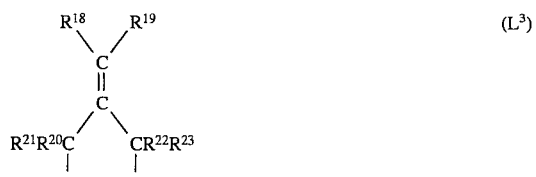

(L³)

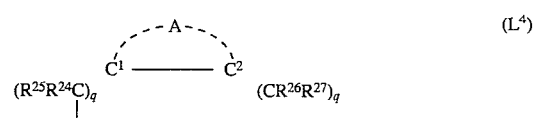

(L⁴)

wherein $R^6$ and $R^7$ each independently represents a $C_1$–$C_4$ alkyl group, $R^{12}$ and $R^{13}$ represents a hydrogen atom or $R^{12}$ and $R^{13}$ together with the atoms to which they are attached complete a 5- or 6-membered alicyclic ring, $R^{18}$ and $R^{19}$ each independently represents a hydrogen atom; a $C_1$–$C_4$ alkyl group or $R^{18}$ and $R^{19}$ together with the atoms to which they are attached complete a ring, $R^8$, $R^9$, $R^{10}$, $R^{11}$, $R^{14}$, $R^{15}$, $R^{16}$, $R^{17}$, $R^{20}$, $R^{21}$, $R^{22}$, $R^{23}$, $R^{24}$, $R^{25}$, $R^{26}$ and $R^{27}$ each independently represents an hydrogen atom or a $C_1$–$C_4$ alkyl group, A represents the necessary atoms for completing a cyclohexane or a tetrahydrofurane, $C^1$ and $C^2$ are linked by a single bond and p and q each independently represents 0 or 1.

2. A method according to claim 1 wherein in said divalent linking chains $L^1$ to $L^4$ $R^6$ and $R^7$ each independently represents a methyl group, a —($X^5$—$R^{28}$)—($X^6$—$R^{29}$)$_r$—$Z^4$ group wherein $X^5$ and $X^6$ each independently represents —S—, —NH— or —N($R^{30}$—$Z^3$)—; $R^{28}$, $R^{29}$ and $R^{30}$ each independently represents a $C_1$–$C_4$ alkylene; r represents 0 or 1 and $Z^4$ represents hydrogen, an amino group, an ammonium group, a hydroxyl, a sulfo group or a carboxyl, $R^{18}$ and $R^{19}$ each represents a hydrogen atom or $R^6$ and $R^7$ or $R^{18}$ and $R^{19}$ together with the atoms to which they are attached complete a 5- or 6-membered ring, and $R^8$, $R^9$, $R^{10}$, $R^{11}$ $R^{14}$, $R^{15}$, $R^{16}$, $R^{17}$, $R^{20}$, $R^{21}$, $R^{22}$, $R^{23}$, $R^{24}$, $R^{25}$, $R^{26}$ and $R^{27}$ each represents an hydrogen atom, p represents 0 and q represents 0 or 1.

3. A method according to claim 1 wherein $X^2$ and $X^3$ each represents —S—, $X^1$ and $X^4$ each independently represents —S—, —NH— or —N($R^5$—$Z^3$)—, $R^1$, $R^2$, $R^3$, $R^4$ and $R^5$ each independently represents a (—$CH_2$)$_s$—0 wherein s represents 2 or 3, n and m each independently represents 0 or 1 and $Z^1$, $Z^2$ and $Z^3$ each independently represents hydrogen, an amino group which may be substituted by a $C_1$–$C_4$ alkyl group or be part of a ring.

4. A method according to 1 wherein said silver halide solvent(s) according to formula (I) is (are) present in said alkaline processing liquid in a total amount of 0.05% by weight to 5% by weight.

5. A method according to claim 1 wherein said development is carried out in the presence of one or more alkanolamines.

6. A method according to claim 5 wherein said alkanolamine(s) is (are) present in a total amount of 0.1% to 5% by weight in said alkaline processing liquid.

7. A method according to claim 1 wherein said silver halide solvent(s) according to formula (I) is (are) present in said imaging element.

8. An imaging element comprising on a support a silver halide emulsion layer and an image-receiving layer containing physical development nuclei, characterized in that said imaging element comprises a silver halide solvent(s), characterized in that at least one of said silver halide solvents is a compound corresponding to the following formula:

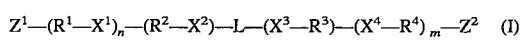

$$Z^1-(R^1-X^1)_n-(R^2-X^2)-L-(X^3-R^3)-(X^4-R^4)_m-Z^2 \quad (I)$$

as defined in claim 1.

* * * * *

UNITED STATES PATENT AND TRADEMARK OFFICE
CERTIFICATE OF CORRECTION

PATENT NO. : 5,536,618
DATED : July 16, 1996
INVENTOR(S) : Rene De Keyzer et al

It is certified that error appears in the above-indentified patent and that said Letters Patent is hereby corrected as shown below:

Column 5, Table 1 (2) should read

Column 5, Table 1 (3) should read

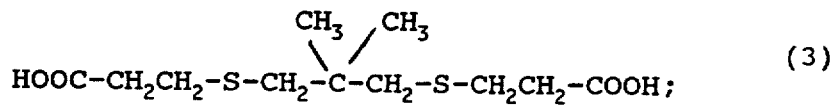

Column 7, line 63, "triazolium thiolares" should read -- triazolium thiolates --;
Claim 3, column 19, line 12, "represents a $(-CH_2)_s-O$ wherein" should read -- represents a $(-CH_2)_s-$ wherein --.

Signed and Sealed this

Nineteenth Day of November, 1996

BRUCE LEHMAN

*Attest:*

*Attesting Officer*     *Commissioner of Patents and Trademarks*